US009312417B2

(12) United States Patent
Vandal et al.

(10) Patent No.: US 9,312,417 B2
(45) Date of Patent: Apr. 12, 2016

(54) PHOTOVOLTAIC MODULES, AND/OR METHODS OF MAKING THE SAME

(75) Inventors: Robert A. Vandal, Syracuse, IN (US); Greg Brecht, Grosse Point Farms, MI (US); Vincent E. Ruggero, II, Lake Orion, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 883 days.

(21) Appl. No.: 12/926,058

(22) Filed: Oct. 22, 2010

(65) Prior Publication Data

US 2012/0097218 A1   Apr. 26, 2012

(51) Int. Cl.
*H01L 31/042* (2014.01)
*H01L 31/048* (2014.01)
*H01L 31/18* (2006.01)
*B32B 17/10* (2006.01)
*C03B 23/025* (2006.01)

(52) U.S. Cl.
CPC ...... *H01L 31/0488* (2013.01); *B32B 17/10036* (2013.01); *B32B 17/1077* (2013.01); *B32B 17/10119* (2013.01); *B32B 17/10706* (2013.01); *B32B 17/10761* (2013.01); *B32B 17/10889* (2013.01); *B32B 17/10917* (2013.01); *C03B 23/025* (2013.01); *H01L 31/18* (2013.01); *Y02E 10/50* (2013.01); *Y02T 10/88* (2013.01); *Y10T 29/49622* (2015.01)

(58) Field of Classification Search
CPC .............. H01L 31/0488; H01L 31/18; B32B 17/10036; B32B 17/10119
USPC ........................................ 136/243, 244, 251
See application file for complete search history.

(56) References Cited

U.S. PATENT DOCUMENTS

| 4,364,766 | A |   | 12/1982 | Nitschke |
|---|---|---|---|---|
| 4,717,790 | A | * | 1/1988 | Gochermann ............... 136/251 |
| 5,030,594 | A |   | 7/1991 | Heithoff |
| 5,149,351 | A |   | 9/1992 | Yaba et al. |
| 5,383,990 | A |   | 1/1995 | Tsuji |
| 5,443,669 | A |   | 8/1995 | Tünker |
| 6,009,726 | A |   | 1/2000 | Funk |
| 6,123,824 | A |   | 9/2000 | Sano et al. |
| 6,158,247 | A |   | 12/2000 | Didelot |
| 6,240,746 | B1 |   | 6/2001 | Maeda et al. |
| 6,288,325 | B1 |   | 9/2001 | Jansen et al. |
| 6,310,281 | B1 | * | 10/2001 | Wendt et al. ................ 136/256 |

(Continued)

FOREIGN PATENT DOCUMENTS

BE   1 013 099   9/2001
JP   2009-170943   7/2009

OTHER PUBLICATIONS

International Search Report mailed Dec. 18, 2012.

(Continued)

*Primary Examiner* — Allison Bourke
(74) *Attorney, Agent, or Firm* — Nixon & Vanderhye P.C.

(57) ABSTRACT

Certain example embodiments relate to techniques for creating improved photovoltaic (PV) modules. In certain example embodiments and first and second glass substrate are provided. A PV array is provided between the first and second glass substrates. The first and second substrates are laminated together with the PV array between the glass substrates. In certain example embodiments the PV module is dimensioned to be similar to an existing roof system (e.g., a sunroof) in a vehicle.

16 Claims, 9 Drawing Sheets

(56) References Cited

U.S. PATENT DOCUMENTS

| | | |
|---|---|---|
| 6,318,125 B1 | 11/2001 | Diederen et al. |
| 6,321,570 B1 | 11/2001 | De Vries, Jr. et al. |
| 6,538,192 B1 | 3/2003 | Coster et al. |
| 6,613,603 B1 | 9/2003 | Sano |
| 6,784,361 B2 | 8/2004 | Carlson et al. |
| 6,983,104 B2 | 1/2006 | Longobardo et al. |
| 7,082,260 B2 | 7/2006 | Longobardo et al. |
| 7,140,204 B2 | 11/2006 | Vandal |
| 7,557,053 B2 | 7/2009 | Thomsen et al. |
| 2004/0229744 A1* | 11/2004 | Heithoff .......................... 501/72 |
| 2004/0261841 A1 | 12/2004 | Negami et al. |
| 2005/0016583 A1* | 1/2005 | Blieske et al. ................ 136/256 |
| 2006/0169316 A1 | 8/2006 | Thomsen et al. |
| 2006/0180200 A1 | 8/2006 | Platzer Bjorkman et al. |
| 2006/0249199 A1* | 11/2006 | Thomsen et al. ............. 136/252 |
| 2007/0215205 A1 | 9/2007 | Thomsen et al. |
| 2008/0308147 A1 | 12/2008 | Lu et al. |
| 2009/0217978 A1 | 9/2009 | Thomsen et al. |
| 2009/0223252 A1 | 9/2009 | Fulton et al. |
| 2010/0122728 A1 | 5/2010 | Fulton et al. |
| 2010/0154477 A1 | 6/2010 | Thomsen et al. |
| 2010/0255980 A1 | 10/2010 | Fulton et al. |

OTHER PUBLICATIONS

Japanese Office Action dated Jun. 1, 2015 for JP 2013-534895.

* cited by examiner

PHOTOVOLTAIC MODULES, AND/OR METHODS OF MAKING THE SAME

FIELD OF THE INVENTION

Certain example embodiments of this invention relate to improved photovoltaic (PV) modules, and/or methods of making the same. More particularly, certain example embodiments relate to PV modules for use on automotive, recreational, marine, and/or other vehicles, and/or methods of making the same.

BACKGROUND AND SUMMARY OF EXAMPLE EMBODIMENTS OF THE INVENTION

Photovoltaic (PV) devices are known in the art (e.g., see U.S. Patent Document Nos. 2004/0261841, 2006/0180200, 2008/0308147; U.S. Pat. Nos. 6,784,361, 6,288,325, 6,613,603, and 6,123,824, the disclosures of which are each hereby incorporated herein by reference).

The use of many current PV devices has been confined to relatively stationary emplacements, such as on the roof of a home or as a part of a larger power plant. Indeed, in certain cases, skyscrapers have been effectively sheathed in PV cells. In recent years, attempts have been made to install PV devices onto more movable devices such as automobiles or boats. One area of focus has been in equipping PV devices onto the roof of a car and/or the sunroof of a car. The addition of a solar sun roof may allow, for example, a car to run a ventilation system when the car is parked in the hot summer sun.

In an example conventional process, the glass used for a sunroof may be installed in a vehicle as part of an overall manufacturing and/or assembly process. The dimensions and shape of the sunroof may be designed ahead of time to meet the structural and design specifications of the vehicle in which the sunroof is to be installed. For example, a sunroof for a car may be curved or flat depending on the specifications of the car manufacturer and/or shape and structure of the car.

While the design aspect of a sunroof may be addressed before final assembly, vehicle manufactures may still have to modify the overall design to accommodate a sunroof. For example, as is known, the addition of a sunroof as a "built in" feature of a car may require a reduction in the overall headroom available within the passenger compartment of the car. Further, the roof of the car may need to be modified in order to accommodate a sunroof (e.g., when the sunroof is in an open position) in certain cases. These structural changes to the car may sometimes increase both the cost and complexity of manufacturing.

Conventionally, equipping a PV device used in transportation (e.g., as a sunroof add-on) may involve adding a single piece of flat or curved tempered glass with a flat commercial PV device attached or mounted directly behind the tempered glass (e.g., on the inside of a sunroof). However, this conventional approach for attaching PV devices to sunroofs may be problematic, e.g., because of the difficulties involved in adding to a sunroof a component that does not necessarily "fit," forming any necessary or desirable electrical connections, matching the size and/or shape of the PV module to the sunroof and/or rooftop, maintaining the desirable structural integrity of the rooftop, etc.

It also will be appreciated that the addition of the PV device to a traditional glass sunroof may increase the overall weight of the vehicle. This increased weight from the PV device attached to the sunroof may adversely affect the performance of the vehicle. Thus, any potential efficiency benefit in providing a PV sunroof may be offset by the increased weight of the car from the addition of the PV device. Further, the additional weight at such a high point in the car may increase the overall center of gravity of the car. This may in turn lead to safety problems (e.g., a higher risk of turn over).

Furthermore, as alluded to above, integrating the newly installed PV device into the structure of the car may require modification of the body of the car because it may not "fit" without such modifications. For example, a traditional sunroof may be adapted to fit into an insert of the roof when the sunroof is open. However, the addition of a PV device with its additional thickness may preclude the modified sunroof from retracting into the body of the roof.

Car manufactures may be able to compensate for this problem by designing car roofs to accommodate sunroofs with PV devices. However, this solution may create more problems. For example, this additional modification to the body of the car may increase the cost and complexity of manufacturing. The additional body modification may add to the at least two body structures already being produced for the car (e.g., one with a sunroof and one without). The additional thickness of the PV device also may further reduce the already reduced headroom provided in the passenger compartment of the car.

In addition, because the PV device may come from a supplier other than a normal sunroof supplier, the addition of the PV device may add more assembly steps and more complexity to the overall manufacturing process. Instead of just installing a sunroof during assembly, a car manufacturer may instead have to install a sunroof and then install the PV device. It will be appreciated that this convention PV installation may require a retooling of a production line.

The aftermarket installation of a PV device may also present additional problems or complications. For already manufactured cars, the addition of a PV device (with its corresponding thickness) to the sunroof may require expensive after market customization including a re-structuring of the roof of the car.

Thus, it will be appreciated that techniques for improved PV use with roofs, sunroofs, and/or the like are continuously sought after. It also will be appreciated that there exists a need in the art for improved PV modules and the like that, for example, can be efficiently installed with or instead of a sunroof in a car.

a method of making an integrated photovoltaic (PV) module for use in a vehicle is provided. A first low-iron glass substrate is provided, with the first substrate having a thickness of between about 1.5-3.5 mm. A second glass substrate is substantially parallel to the first substrate, with the second substrate having a thickness between about 1.5 and 3.5 mm. A PV array is provided between a major surface of the first glass substrate and a major surface of the second glass substrate. The first and second substrates are laminated together with the PV array therebetween. The PV module is dimensioned, shaped, and structured to weigh according to a predetermined dimensions, shape, and weight in relation to the roof of the vehicle.

In certain example embodiments, a method of making an integrated PV module for a rooftop a vehicle is provided. A first glass substrate having a first thickness is provided. A second glass substrate is substantially parallel to the first substrate and has a second thickness. The second substrate has a higher iron content and lower visible transmission than the first substrate. A solar cell array is inserted between the first and second glass substrates. The first and second glass substrates are laminated together with the solar cell array therebetween.

According to certain example embodiments, a method of making a vehicle is provided. An integrated PV module according is provided and built into the vehicle. The vehicle may be an automobile, truck, tractor, boat, plane, etc.

In certain example embodiments, an integrated PV module configured to replace an existing sunroof is provided. A first glass substrate has a thickness of 1.5-3.5 mm. A second glass substrate is substantially parallel to the first substrate and has more iron and a lower visible transmission than the first substrate. A CIGS-based solar cell array is disposed between a major surface of the first glass substrate and a major surface of the second glass substrate, with the thin film solar cell array having electrical leads connected thereto. The first and second substrates are laminated together with PVB. The PVB seals the solar cell array between the first and second substrates, and the electrical leads extend through the PVB and out of the integrated PV module. The integrated PV module is dimensioned to be structurally similar to the existing sunroof.

In certain example embodiments laminating PV cells between two glass substrates and two pieces of laminate material may provide safety and acoustical benefits. Alternatively, or in addition to, the laminated PV module may preserve the PV cells both through UV filtering as will as mechanical protection.

In certain example embodiments the use of flexible CIGS thing film PV cells in a laminate allows the PV module to be shaped in a manner similar or equal to the curvature as other automotive or transportation roof systems.

In certain example embodiments the integrated PV module may be similar to normal roof glass for vehicles. Differences may include that the PV module contains electrical connections for the PV cells and that the PV cells of the PV module may generate electricity for use in vehicle systems.

In certain example embodiments the PV module with included glass substrates, PV cells, and laminates may be similar in weight to standard glass roof systems for vehicles. Further, replacement of standard glass roof systems with an integrated PV module may provide safety and efficiency benefits to the passengers and car.

The features, aspects, advantages, and example embodiments described herein may be combined in any suitable combination or sub-combination to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments may relate to PV modules comprising two glass substrates, a PV layer disposed therebetween, and a bonding agent to bond the glass substrates and the PV layer together into one integrated PV module.

PV devices come in many forms. One area of PV devices is Thin Film Solar Cells (TFSC). Examples of TFSC devices include CIGS ($Cu(In, Ga)(Se, S)_2$) and CIS ($CuInSe_2$) solar cells.

CIGS and CIS type photovoltaic devices may include, from the front or light incident side moving rearwardly, a front substrate of a material such as glass, a front electrode comprising a transparent conductive layer such as a TCO (transparent conductive oxide), a light absorption semiconductor film (e.g., CIGS and/or CIS film), a rear electrode, and a rear substrate of a material such as glass. Sometimes an adhesive is provided between the front substrate and the front electrode, and it is also possible for window layer(s) (e.g., of or including CdS, ZnO, or the like) to be provided. Photovoltaic power is generated when light incident from the front side of the device passes through the front electrode and is absorbed by the light absorption semiconductor film as is known in the art.

The layers in TFSC devices may range from between a few nanometers to a few micrometers. However, certain problems may arise when using TFSC in a PV installation. First, the materials used in certain TFSC cells (e.g., indium, gallium, cadmium) may be potentially harmful to humans. Further, certain TFSC elements may be adversely affected by the outside environment. For example, elements in CIGS may suffer degradation and may lead to a reduced life span and/or efficiency of the solar cell when exposed to damp conditions. Accordingly, it will be appreciated that protecting TFSC cells from the outside environment and protecting the outside environment (e.g., humans) from TFSC elements may be desirable.

Figure 1:
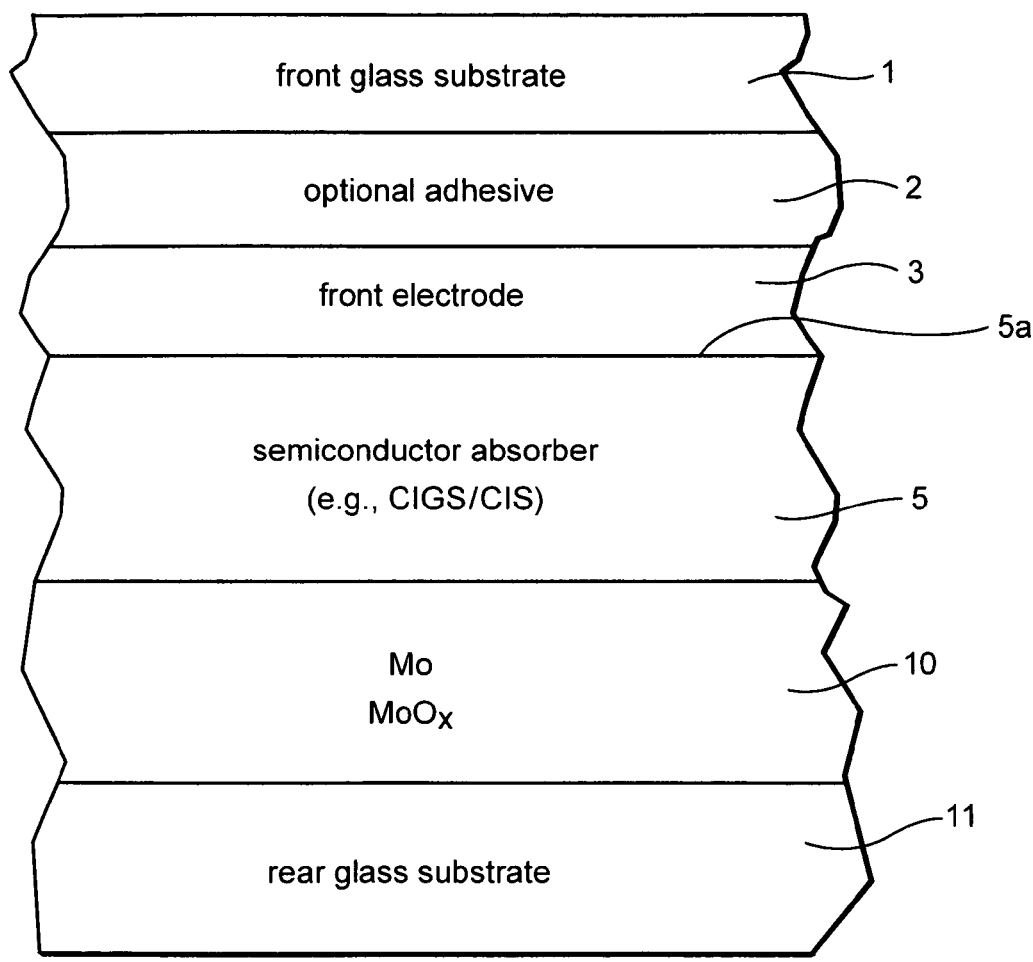
FIG. 1 is an illustrative cross-sectional view of an example photovoltaic device according to an example embodiment.

Referring now more particularly to the drawings in which like reference numerals indicate like parts throughout the several views. FIG. 1 includes transparent front glass substrate 1, optional adhesive film 2, single layer or multilayer front conductive electrode 3, active semiconductor film 5 of or including one or more semiconductor layers (such as CIGS, CIS, or the like), electrically conductive back electrode/reflector 10, and rear glass substrate 11. The light incident surface 5a of the semiconductor film 5 may or may not be textured in different embodiments of this invention. Rear electrode 10 is preferably continuous or substantially continuous across all or a substantial portion of glass substrate 11, although it may be patterned into a desired design (e.g., stripes) in certain instances. The optional adhesive 2 may be of or include an electrically insulating polymer based and/or polymer inclusive encapsulant or adhesive of a material such as ethyl vinyl acetate (EVA), polyvinyl butyral (PVB), or the like. In certain example embodiments, polymer based adhesive layer 2 has a refractive index (n) of from about 1.8 to 2.2, more preferably from about 1.9 to 2.1, with an example being about 2.0, for purposes of enhancing internal reflection if textural back glass is used. Of course, other layer(s) that are not shown may also be provided in the device. For instance, buffer and/or window layer(s) may also optionally be provided.

A metal such as Mo (molybdenum) may be used as the rear electrode (bottom contact) 10 of a photovoltaic device, such as a CIS solar cell. In certain instances, the Mo may be sputter-deposited onto a soda or soda-lime-silica rear glass substrate 11 of the photovoltaic device. Rear electrodes (e.g., Mo rear electrodes) 10 preferably have low stress, high conductivity, and good adhesion to the rear substrate (e.g., glass substrate) 11. In order to provide this combination of features, oxygen is introduced into the Mo based rear electrode 10 at the initial stage of deposition of the rear electrode on the substrate 11 or otherwise in certain example embodiments of this invention. The application of the oxygen to the Mo-based rear electrode 10 reduces the overall stress of the rear electrode and at the same time promotes adhesion of the rear electrode 10 to the glass soda or soda lime silica glass substrate 11. However, in certain large sputter coaters designed for large substrate widths such as greater than one meter, it is sometimes difficult to control the uniformity of oxygen in the final rear electrode film due to the different pumping speeds between reactive gas (e.g., oxygen) and sputtering gas (e.g., Ar). In the FIG. 1 embodiment, the Mo-based rear electrode (which may be oxidation graded) is supported by a substantially flat surface of the rear substrate 11. However, in other example embodiments, the rear electrode may be formed on a textured surface of the rear substrate 11.

Figure 2A:
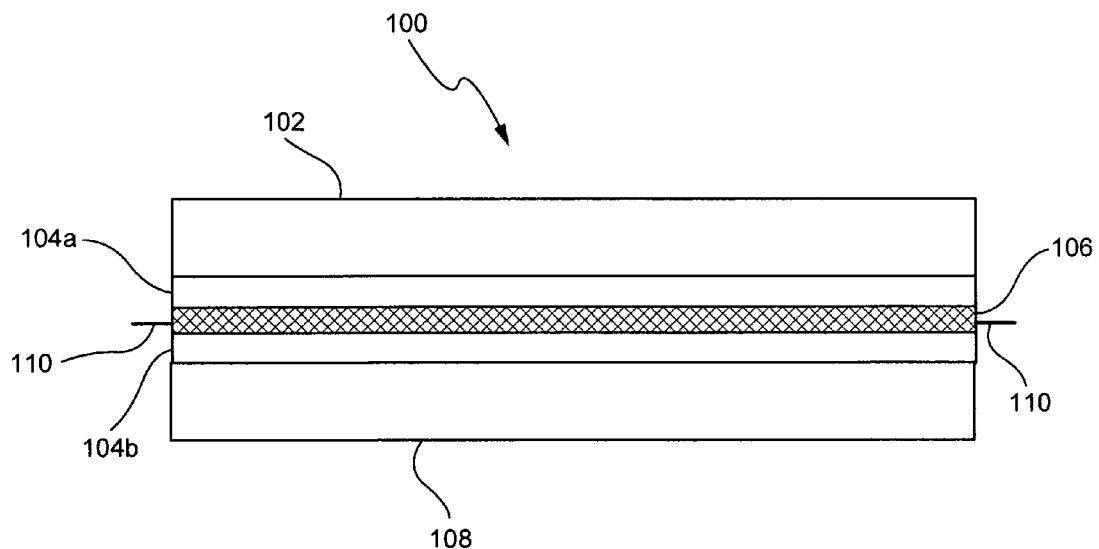
FIG. 2a is an illustrative cross-sectional view showing the components of an exemplary PV module in accordance with an example embodiment.

FIG. 2a is an illustrative cross-sectional view showing the components of an exemplary PV module in accordance with an example embodiment. A PV module 100 with a first glass substrate 102 may be provided. A second glass substrate 108 on the underside of PV module 100 (e.g., opposite where the sun impinges on the PV module 100) may be provided. One or more functional PV layer(s) 106 may be disposed between the first glass substrate 102 and the second glass substrate 108. For instance, in certain example embodiments, the functional PV layer(s) 106 may be supported by the second substrate 108. First and second laminating materials 104a and 104b may be used to laminate together the first and second substrates 102 and 108. Thus, the front substrate 1 in FIG. 1 may be the outer substrate 102 in FIG. 2, the rear glass substrate 11 in FIG. 1 may be the second substrate 108 in FIG. 2, and optional adhesive layer 2 in FIG. 1 may be first the laminating material 104a in FIG. 4, and the functional PV layers 106 in FIG. 2 may be of or include layers 2, 3, 5, and 10 from FIG. 1. However, unlike the FIG. 1 example arrangement, a second laminating material 104b may be provided. In certain example embodiments a PV layer 106 may include PV layers (e.g., layers 2, 3, 5, and/or 10) disposed (e.g., deposited) onto a film such as a thin stainless steel foil or a conductive coated polymer. Other substrates and/or materials may be used in different embodiments of this invention.

Figure 2B:
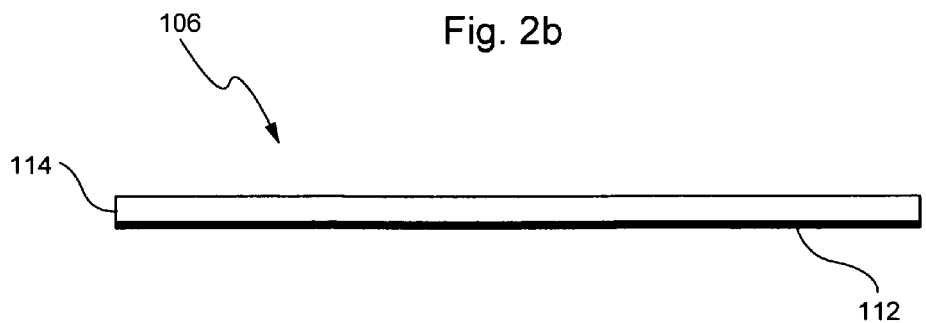
FIG. 2b is an illustrative cross-sectional view showing the components of an exemplary PV layer in accordance with an example embodiment.

FIG. 2b is an illustrative cross-sectional view showing the components of an exemplary PV layer in accordance with an example embodiment. A PV layer 106 may include a disposed PV material 114 (e.g., CIGS) onto a substrate 112. The substrate may, for example, be a stainless steel foil. In certain example embodiments, PV layer 106 may have a width of less than 1 mm, more preferably less than 0.7 mm, and sometimes of about 0.5 mm.

The laminating materials 104a and 104b may help to both laminate together the first and second substrate 102 and 108, and encapsulate the PV layer(s) 106. The laminating materials 104a and 104b may be composed of a material such as polyvinyl butyral (PVB) or ethylene-vinyl acetate (EVA) of a thickness between about 0.38 mm and 0.76 mm. UV curable liquid urethanes may also be used as a laminated material in certain example embodiments. The laminating may be accomplished using conventional techniques including, for example, heat and/or pressure based laminating techniques, exposure to UV radiation (e.g., for UV-curable materials), etc. Sandwiching the PV layers 106 with first and second laminating materials 104a and 104b may be advantageous in certain example embodiments, as it may allow the PV module to be more flexible and/or adaptable for insertion in between the inner and outer substrates of a variety of differently sized and/or shaped sunroofs. The first and second laminating materials 104a and 104b may be the same or different laminating materials in different embodiments of this invention.

PV layer 106 may contain a layout of PV cells that may be interconnected by copper conductive ribbon strips. In certain example embodiments, the PV cells may be single junction solar cells. Alternatively, PV cells may be multi or tandem junction solar cells. Electrical connections to the PV cells may be made via a conductive adhesive, solder, or the like. Two or more ribbon leads 110 may extend outwardly from one or more edges of the PV module 100, e.g., to interface with desired applications (e.g., an energy grid, an appliance such as, for example, a fan or air conditioner, a deep cycle battery array for storage, the drive battery for a hybrid or electric vehicle, etc). It will be appreciated that in other example embodiments, there may be one ribbon lead extending from the PV module. In certain other example embodiment there may be two ribbon leads extending from one point along the edge of the PV module.

The thickness of the glass substrates may be between about 1.5 to 3.5 mm. However, the overall thickness, weight, and durability options for glass substrates 102 and 108 and the PV module 100 may vary with specific application considerations for the PV module. For example, a PV module installed on a sailboat may need to be more durable (e.g., to resist conditions that may come about when at sea) than one installed in the sunroof of a car. For instance, in certain example embodiments, glass substrate 102 may have a thickness of around 2.0 mm and glass substrate 108 may have a thickness of around 1.6 mm.

The two glass substrate 102 and 108 may include a printed pattern on either major surface. The pattern may frame the PV cells of the PV layer 106 and may hide the gaps and interconnections of the PV layer from view, for example. The pattern may be formed from a fired ceramic frit, enamel, or other appropriate material for application to the glass substrates. For example, a UV cured acrylate or organic material may be used on the inner surfaces of the glass substrates. These and/or other materials may be screen printed on the desired surface in the desired locations to form the desired pattern in certain example embodiments.

The two glass substrates 102 and 108 may be of various thickness and color. As it may be desirable to provide reduced impedance for light travel to the PV layer 106, a high transmission type glass may be desirable for glass substrate 102. High transmission, low iron glass may be used in certain example embodiments. See, for example, U.S. Pat. Nos. 7,700,870; 7,557,053; and 5,030,594 and U.S. Publication Nos. 2006/0169316; 2006/0249199; 2007/0215205; 2009/0223252; 2010/0122728; 2009/0217978; and 2010/0255980, the entire contents of each of which are hereby incorporated herein by reference.

An exemplary soda-lime-silica base glass according to certain example embodiments, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

Other minor ingredients, including various conventional refining aids, such as $SO_3$, carbon, and the like may also be included in a base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments, the resulting glass has visible transmission of at least 75%, more preferably at least 80%, even more preferably of at least 85%, and most preferably of at least about 90% (sometimes at least 91%) (Lt D65).

In certain embodiments, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS

| Ingredient | General (Wt. %) | More Preferred | Most Preferred |
|---|---|---|---|
| total iron (expressed as $Fe_2O_3$) | 0.001-0.06% | 0.005-0.045% | 0.01-0.03% |
| % FeO | 0-0.0040% | 0-0.0030% | 0.001-0.0025% |
| glass redox (FeO/total iron) | <=0.10 | <=0.06 | <=0.04 |
| cerium oxide | 0-0.07% | 0-0.04% | 0-0.02% |
| antimony oxide | 0.01-1.0% | 0.01-0.5% | 0.1-0.3% |
| $SO_3$ | 0.1-1.0% | 0.2-0.6% | 0.25-0.5% |
| $TiO_2$ | 0-1.0% | 0.005-0.4% | 0.01-0.04% |

In certain example embodiments, the antimony may be added to the glass batch in the form of one or more of $Sb_2O_3$ and/or $NaSbO_3$. Note also $Sb(Sb_2O_5)$. The use of the term antimony oxide herein means antimony in any possible oxidation state, and is not intended to be limiting to any particular stoichiometry.

The low glass redox evidences the highly oxidized nature of the glass. Due to the antimony (Sb), the glass is oxidized to a very low ferrous content (% FeO) by combinational oxidation with antimony in the form of antimony trioxide ($Sb_2O_3$), sodium antimonite ($NaSbO_3$), sodium pyroantimonate ($Sb(Sb_2O_5)$), sodium or potassium nitrate and/or sodium sulfate. In certain example embodiments, the composition of the glass substrate includes at least twice as much antimony oxide as total iron oxide, by weight, more preferably at least about three times as much, and most preferably at least about four times as much antimony oxide as total iron oxide.

In certain example embodiments, the colorant portion is substantially free of other colorants (other than potentially trace amounts). However, it should be appreciated that amounts of other materials (e.g., refining aids, melting aids, colorants and/or impurities) may be present in the glass in certain other embodiments without. For instance, in certain example embodiments, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

In view of the above, glasses according to certain example embodiments achieve a neutral or substantially clear color and/or high visible transmission. In certain embodiments, resulting glasses according to certain example embodiments may be characterized by one or more of the following transmissive optical or color characteristics when measured at a thickness of from about 1 mm-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | =0.003% | <=0.0020% |
| L* (Ill. D65, 10 deg.): | 90-99 | n/a | n/a |

TABLE 3-continued

GLASS CHARACTERISTICS OF EXAMPLE EMBODIMENTS

| Characteristic | General | More Preferred | Most Preferred |
|---|---|---|---|
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

Figure 3:
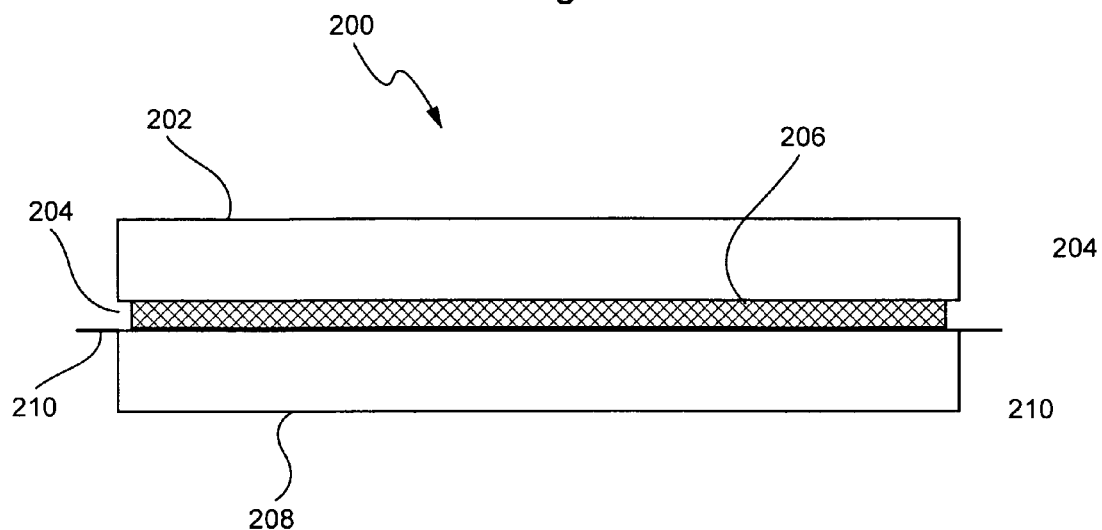
FIG. 3 is an illustrative cross-sectional view of a exemplary PV module after bonding has taken place in accordance with an example embodiment.

FIG. 3 is an illustrative cross-sectional view showing an exemplary PV module after bonding has taken place in accordance with another example embodiment. PV module 200 may include glass substrates 202 and 208 with a PV layer 206 disposed therebetween. The PV layer 206 may be dimensioned smaller than glass substrates 202 and 208. After laminating PV module 200, laminate material 204 may form a seal around the outer edges of the first glass substrate 202 and the second glass substrate 208. In the FIG. 3 example view, the laminate material 204 is shown only at the periphery of the glass substrates 202 and 208. However, in different embodiments, the laminate may be provided along substantially all of the first and/or second substrates 202 and 208 including, for example, at least at the peripheral edges thereof. The laminate 204 may in certain example instances help seal the PV layer from the outside environment. This may help to reduce the likelihood of deterioration of the PV layer (e.g., by keeping moisture away from the PV cells). It also may help to keep the potentially hazardous PV material "inside" the sunroof and away from the outside environment (including any persons in the cabin of the vehicle). Extending out from the PV layer 206 and through the laminated material 204 may be conductive ribbon leads 210. Conductive ribbon leads 210 may interface with outside energy storage units (e.g., a battery) or energy consumers (e.g., a fan).

Figure 4A:
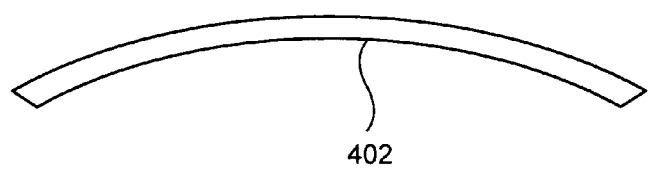
FIG. 4a is an illustrative cross-sectional view of exemplary formed glass substrates in accordance with an example embodiment.
Figure 4A:
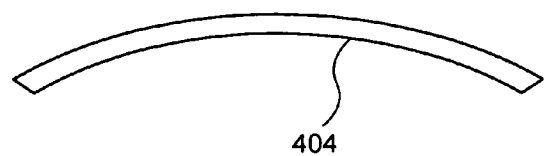
Figure 4B:
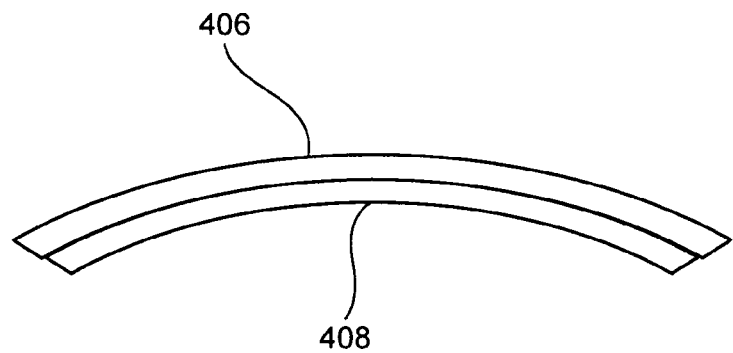
FIG. 4b is an illustrative cross-sectional view of exemplary formed glass substrates in accordance with an example embodiment.

FIG. 4a is an illustrative cross-sectional view of exemplary formed glass substrates in accordance with an example embodiment. In certain example embodiments glass substrates 402 and 404 used in example PV modules may be curved. For example, the sunroof of an automobile may be slightly curved. Thus, a PV module replacing a conventional sunroof may be curved in a manner similar to that of a curved sunroof.

Devices and methods for heat bending glass sheets are well known in the art. For example, see U.S. Pat. Nos. 5,383,990; 6,240,746; 6,321,570; 6,318,125; 6,158,247; 6,009,726; 4,364,766; 5,443,669; 7,140.204; 6,983,104; and 7,082,260, of which the entire contents of each are hereby incorporated herein by reference.

Accordingly, glass substrates 402 and 404 may be individually hot-bended. Alternatively, now referring to FIG. 4b where an illustrative cross-sectional view of exemplary formed glass substrates in accordance with an example embodiment is shown, the glass substrates 406 and 408 may be hot-bended as a unit. This may be done for economical reasons (e.g., only one hot bend may be done for two glass substrates) and/or to help provide substantially similar curvatures to the two glass substrates.

Figure 5:
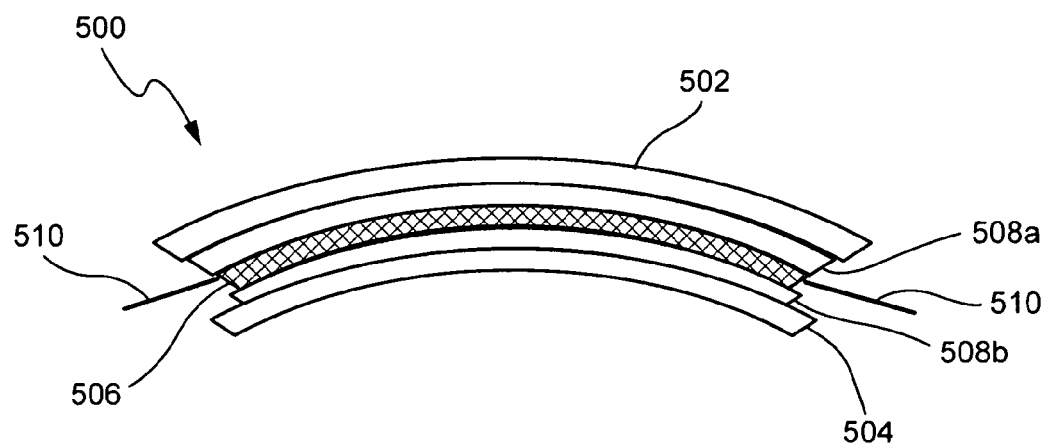
FIG. 5 is an illustrative cross-sectional view of an exemplary PV module in accordance with an example embodiment.

FIG. 5 is an illustrative cross-sectional view of an exemplary PV module after a bonding process in accordance with an example embodiment. PV module 500 may include two curved glass substrates 502 and 504 that are dimensioned and formed as desired, a PV layers 506. As described above, first and second laminating materials 508a and 508b may be used to both laminate together the first and second substrates 502 and 504, as well as encapsulate the PV layers 506. Post bonding, PV module 500 may be structurally similar to one convention piece of glass. Ribbon leads 510 may also be provided to facilitate electrical current transfer from the PV layer 506 for use outside of PV module 500.

FIG. 6 is an illustrative plan view showing an exemplary installation of a PV module installed into a roof an automobile in accordance with an example embodiment. A PV module 604 may be installed into the roof 602 of a car 600. For example, the installation of PV module 604 may replace, or be used instead of, a standard sunroof. Electrical leads 606 connected to a PV layer of the PV module 604 may lead out of the PV module. The electrical leads 606 may then be connected with the electrical systems of the car 600. Alternatively, the electrical leads 606 may be connected to a dedicated device (e.g., a ventilation fan).

A conventional car sitting in a parking lot on a hot summer day may cause the interior of the car to substantially heat up. Conventionally, one option of combating the increased heat built up in the interior of the car is to open the windows to provide a means of egress for the hot air in the car to escape to the outside. One drawback associated with this option is that leaving the windows of the car open may leave the car less secure than with the windows closed. Another conventional option may be to put up a heat shield on the windshield of the car. However, while this option may reduce the rate of heat build up, it may not provide a means of transferring built up heat from the interior of the car to the exterior airspace.

In certain instances a PV module with electrical connections may provide an independent power source to drive a fan, air conditioner, heater, or the like. Thus, electrical leads 606 may be connected to an independent (e.g., not dependent on the car's power systems—battery or engine) efficient air conditioner of car 600. Alternatively, or in addition, the electrical leads 606 may interface with the electrical and power systems of car 600. This may facilitate, for example, usage of the radio, speakers, etc., of the car when the car is not turned and without draining the main car battery.

In certain other example embodiments, a dedicated backup battery may be provided. The electrical leads from a PV module may be connected directly to the backup battery. The PV module may then help to keep the backup battery in a charged state such that the backup battery may be available in emergency situations (e.g., when the main battery in the car dies or run out). It will be appreciated that a PV module may be electrically connected to various other power systems in and out of a vehicle such as, for example, the drive battery system for a hybrid or electric vehicle.

In operation, the PV module 604 installed into the roof 602 of car 600 in place of a sunroof may function in a manner similar to the uninstalled sunroof. In certain example embodiments, the dimensions (e.g., shape, thickness, etc) of the PV module 604 may be substantially similar to that of the uninstalled sunroof. This may facilitate, for example, usage of the PV module as a sunroof such that the PV module may be retracted in a manner similar to a sunroof. In certain example embodiments the electrical leads 606 may be modified to provide a continuous link (e.g., such that electrical connectors extending upwardly from the sunroof and/or downwardly from the frame of the car for a sort of electrically connected track). For example, electrical leads 606 may be extendable such that when PV module 604 is retracted from the roof of the car (e.g., in a manner similar to that of a sunroof) that the electrical leads, even though they are now in a different position in the roof, are still connected. Alternatively, electrical leads may be structured to be in contact with outside electrical sources when the PV module is in a closed position. In other words, when PV module is closed the electrical leads may come into contact with pre-arranged leads. When the PV module is retracted (and the sunroof is open) the electrical leads 606 may be separated from the vehicle electrical system. In other example embodiments, electrical leads may extend from the PV module at the same general location. Such embodiments may facilitate connecting the PV module to external systems (e.g., because the interface to the PV module is in one location). It will be appreciated that other techniques for interfacing the electrical leads of PV module with the car and/or other outside electrical consumers may be implemented.

Figure 6A:
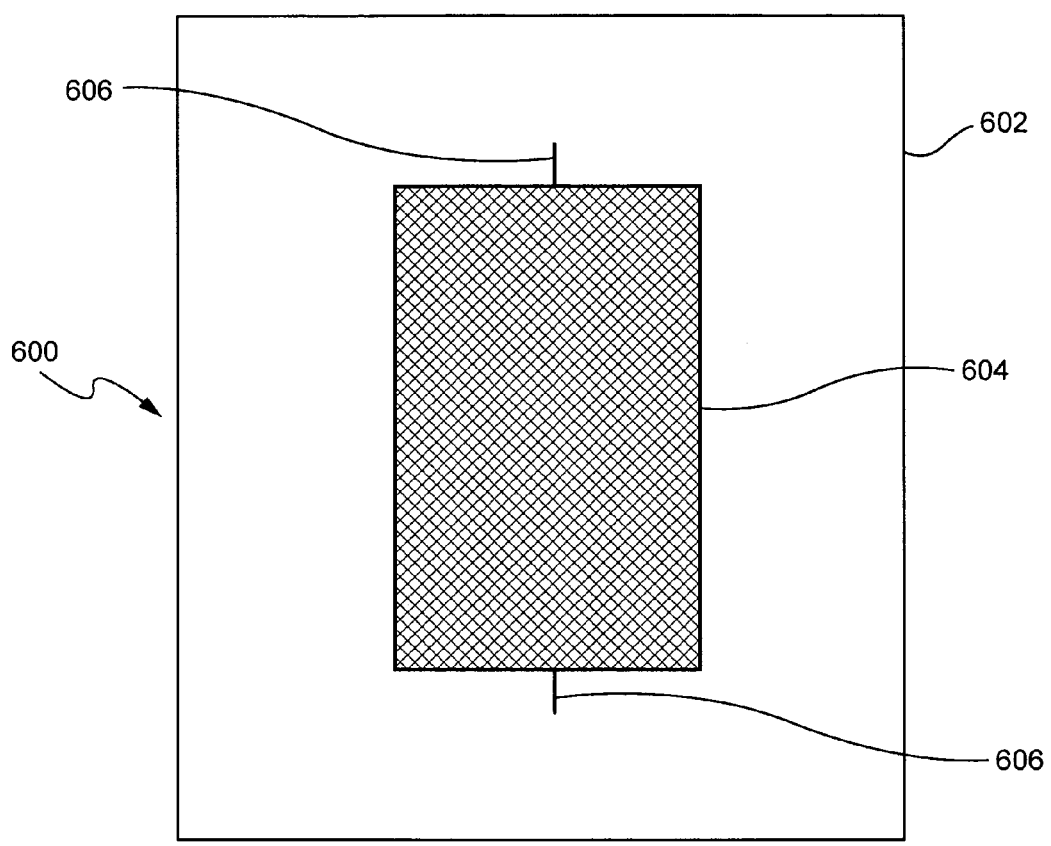
FIG. 6a is an illustrative plan view showing an exemplary installation of a PV module in a roof of an automobile in accordance with an example embodiment.
Figure 6B:
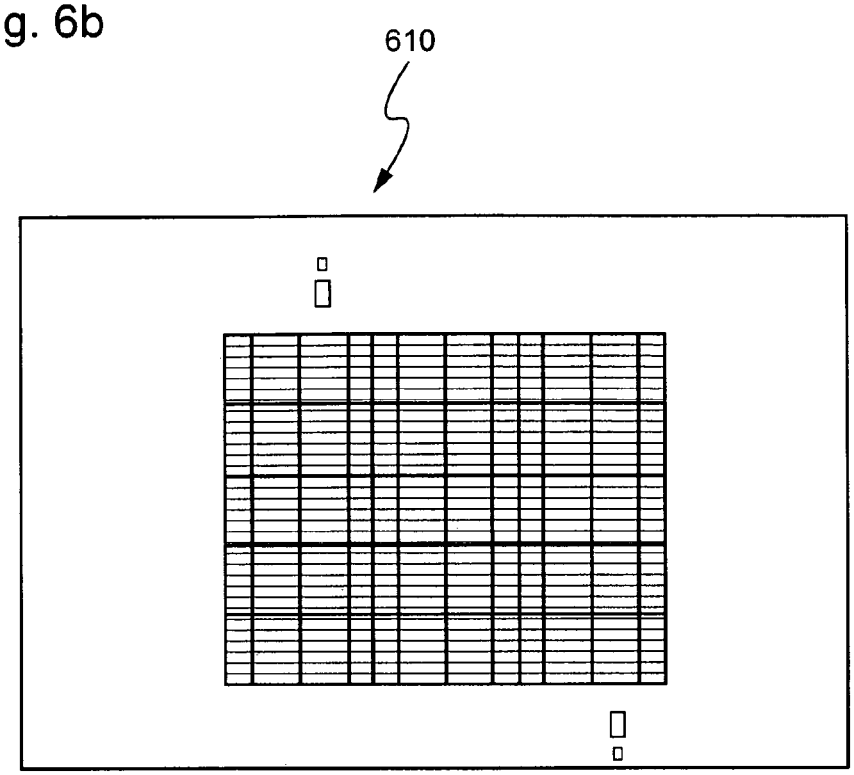
FIGS. 6b, 6c, and 6d are illustrative plan views showing exemplary geometries of PV modules in accordance with example embodiments.
Figure 6C:
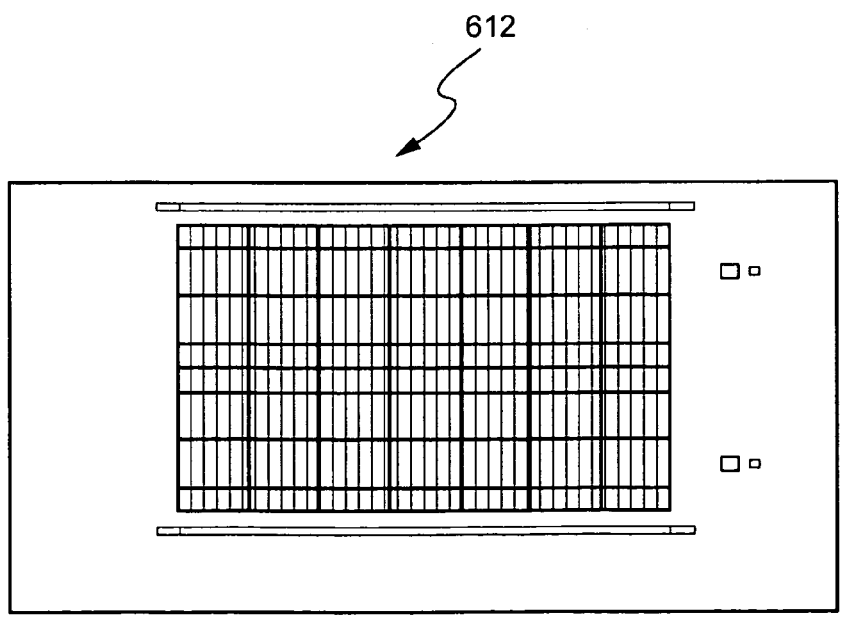
Figure 6D:
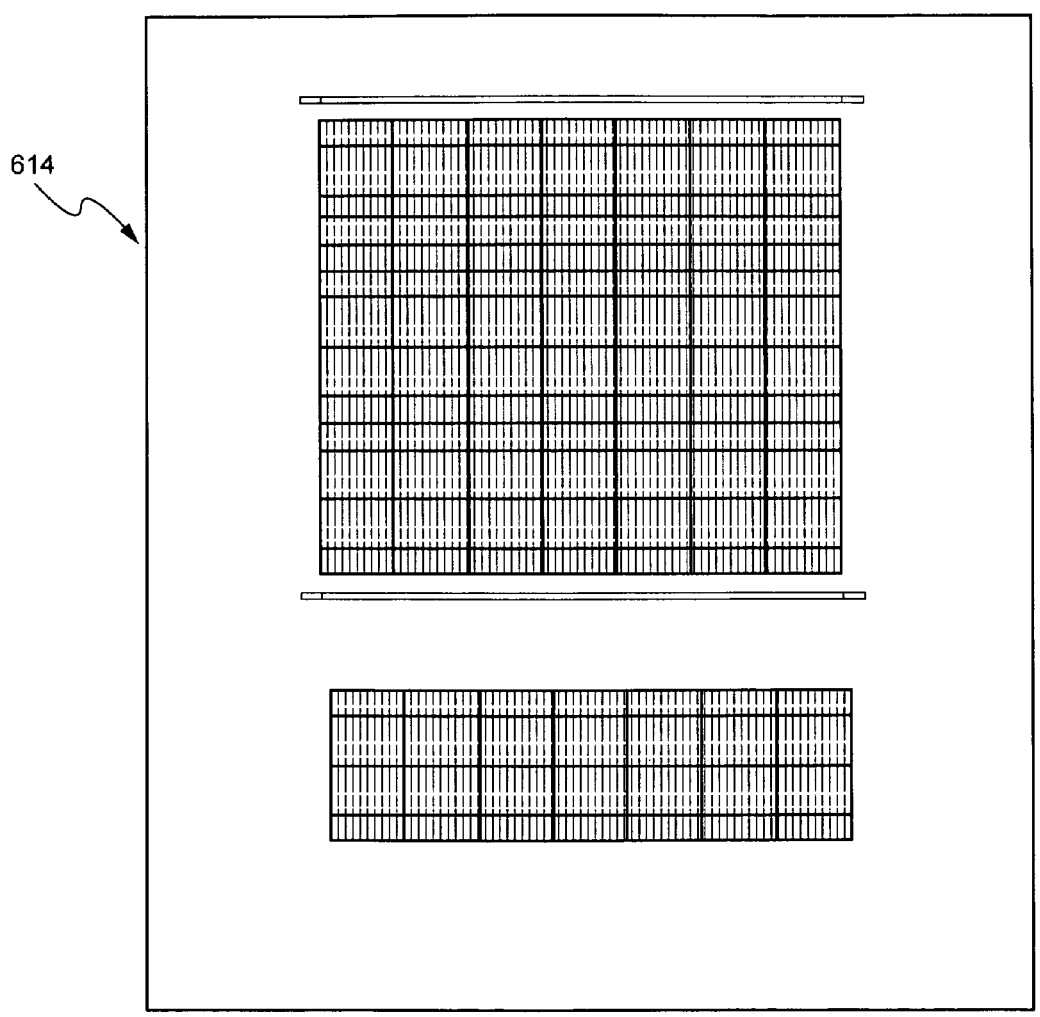

FIGS. 6b, 6c, and 6d are illustrative plan views showing exemplary geometries of PV modules in accordance with example embodiments. It will be appreciated that the grid patterns shown in these drawings and discussed herein are exemplary and that other patterns may be used in different example embodiments of this invention.

PV module 610 is an example 15-string PV assembly. PV module 610 may have a area of about 0.32 square meters and have an estimated power output of around 30 watts (e.g., depending on environmental conditions).

PV module 612 is an example 14-string PV assembly. PV module 612 may have a area of about 0.30 square meters and have an estimated power output of around 28 watts (e.g., depending on environmental conditions).

PV module 614 is an example 28-string PV assembly. PV module 614 may have a area of about 0.61 square meters and have an estimated power output of around 56 watts (e.g., depending on environmental conditions).

Figure 6E:
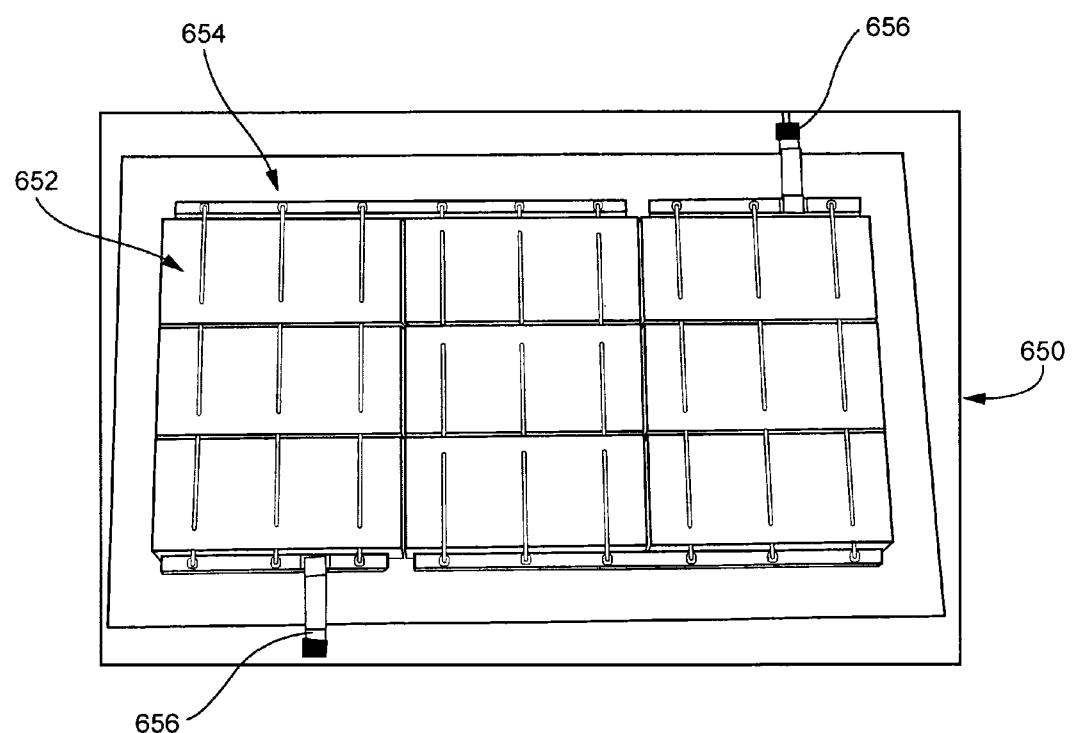
FIG. 6e is a bottom view showing an exemplary PV module according to certain example embodiments.

FIG. 6e is a bottom view showing an exemplary PV module according to certain example embodiments. PV module 650 may have a conductive adhesive 652 to make electrical connections among the solar cells. The conductive adhesive may include an adhesive such as, for example, silver epoxy that is equal parts silver adhesive and adhesive hardener. Such an epoxy may be obtained from, for example, Applied Technologies, e.g., under the designations 100A and 100B.

The conductive adhesive 652 may interface with the conductive ribbon strips 654. The conductive ribbon strips 654 may be constructed out of copper or some other conductive material (e.g., silver, etc). Conductive ribbon strips 654 may then connect to ribbon leads 656. Ribbon leads 656 may exit the PV module at one or more edges of a laminate (e.g., as shown in FIG. 3) as power connections at locations specified according to design needs.

Figure 7:
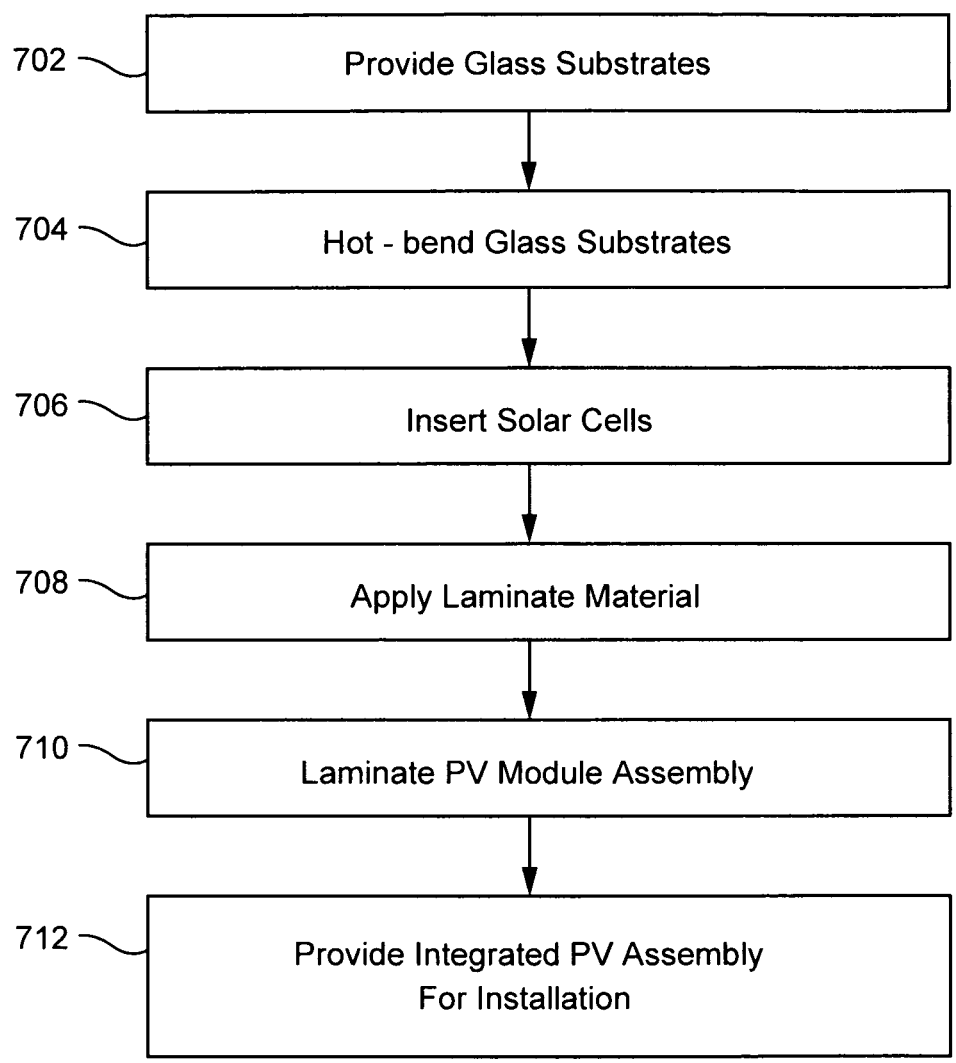
FIG. 7 is a flowchart of an illustrative process for making a PV module for use in a roof.

FIG. 7 is a flowchart of an illustrative process for making a PV module for use in a roof. In step 702 glass substrates for a PV module are provided. As discussed above, the glass substrates may be of different types and qualities (e.g., the first glass substrate may be a high transmission/low iron type of glass). The glass substrates may be processed such that the substrates both have an appropriate perimeter and edge finish for the given implementation of a PV module (e.g., design of the glass substrates may depend on their application, such as, for example, a sunroof). Further, certain painted patterns using the aforementioned ceramic enamels may also be added.

Next, in step 704, the glass substrates may then be hot formed to meet the specifications of use for PV module. Once the surface shape and/or geometry of the glass substrates meets the specifications of a given application, a PV layer consisting of PV cells may be inserted between the glass substrates in step 706.

As discussed above, thin film solar cells (e.g., CIGS or CIS, etc.) may be used in certain example embodiments. In certain example embodiments, the glass substrates may be aggressively shaped (e.g., the curvature of the glass substrates may be more than normal). In such example embodiments a thin film solar cell such as, for example, CIGS may be preferred. However, it will be appreciated that other types of solar cell technology may be implemented (e.g., crystalline silicon solar cells).

In step 708, a laminate may be applied to encapsulate the PV layer between the provided glass substrates. Polyvinyl butyral (PVB), ethyl vinyl acetate (EVA), or the like, may be used in certain example embodiments. In certain example embodiments, the PVB thickness may range from 0.1-1.0 mm, more preferably 0.38 or 0.76 mm. In certain example embodiments, the particular laminate material may be formulated so to help provide for long term durability and good adhesion over time. Other laminates with similar adhesion strength, sealing, durability, optical characteristics, and/or other qualities may also be used. For example, one-, two-, or more-part urethanes may be used in certain example embodiments. Adhesives (e.g., pressure sensitive adhesives) also may be used in certain example embodiments. Once the glass substrates, PV layer, and the laminate are combined, (e.g., oriented proximate to one another), the PV module may then subject to heat and pressure in step 710. The application of heat and/or pressure may facilitate the bonding of the two glass substrates through the laminate, sealing the PV layer therein. Further, in certain example embodiments the heat and pressure may allow the laminate (e.g., PVB) to become optically clear. Of course, certain laminate materials may be cured by means other than heat and pressure such as, for example, UV curable materials.

Once bonded together, the two glass substrates with the PV layer sandwiched therebetween may be structurally similar to a single integrated unit (e.g., similar to an ordinary sun roof to be placed into a car). Thus, in step 712, the newly created PV module may be ready to be installed as into the roof of a car. In other words, given the dimensions or design considerations of an ordinary sunroof, the combination of the two glass substrates with the sealed PV array laminated between them may provide an integrated unit that may be proportioned and shaped in a manner substantially similar to that of the ordinary sunroof. It will be appreciated that the process of creating PV modules may create cost savings in the assembly process of a car. First, vehicle manufacturers may now not need to modify the body of the vehicle to accommodate a PV equipped sunroof. Second, as certain example embodiments may provide integrated PV modules (e.g., sun roofs with integrated PV arrays) vehicle manufactures may install a prepackage PV module in a manner similar to the installation of a conventional sunroof. It will be appreciated that this may save both time and money for vehicle manufacturers. Furthermore, in certain example embodiments the dimensioned glass substrates and PV array may be no thicker than an ordinary sunroof. Accordingly, installation of a PV equipped sunroof may not reduce the overall headroom available in the vehicle. In certain example embodiments an integrated PV module may have a thickness substantially similar to that of an ordinary sunroof and may thus be retractable and allow an opening of a sunroof.

As is known in the art, a conventional sunroof may be encapsulated through an injection molding system using thermoplastics or reaction injection molding process using conventional urethanes. Such techniques may facilitate the sealing and mounting of a glass sunroof. Likewise, an integrated PV module (e.g., PV module 200) may be encapsulated using similar or identical techniques. Accordingly, the encapsulation of, for example, PV module 200 through such techniques may facilitate direct replacement of existing roof systems. In addition, encapsulation may facilitate the routing of conductors and connector for PV functions (e.g., electrical leads, etc).

It will be appreciated that the steps for in FIG. 7 may be performed in various orders and/or certain steps may not be performed at all in different embodiments of this invention. For example, a laminate material may be provided to the glass substrates and then the PV cells may be sandwiched between the laminate material and the glass substrates.

Certain PV modules for use in certain vehicles (e.g., cars) may need to meet testing standards in order to available for public use. It will be appreciated that the techniques herein may provide for meeting and/or exceed requirements for AS-3 laminates. For example, certain example embodiments may pass the following tests: 1) 30 ft. impart dart test; 2) 30 ft. small impact ball test; 3) 2 hour boil test; and 4) 2 week water fog exposure. In addition, certain other example embodiments may meet and or pass other non-required tests, for example: 1) 2 week salt fog exposure; 2) 1000 hour 85 degree/85% RH exposure; 3) Shear test for the PV cell in the PV module; and 4) shear test at a copper bus. Accordingly, certain example embodiments may be constructed to meet and/or exceed certain tests (e.g., safety, durability, etc).

Although certain example embodiments have been described using hot-bending, certain other example embodiments may alternatively, or in addition to, use cold-bending to shape the glass substrates.

While certain example embodiments may have been described using TFSC, other example embodiments may use other types of solar cells. For example crystalline silicon (c-Si) may be used in conjunction with the above techniques. Other example embodiment may use amorphous silicon (e.g., a-Si), microcrystalline silicon, and/or other materials.

The glass substrates may have the same or different compositions in different embodiments. For example, in certain example embodiments, it may be desirable to provide a low iron substrate as the outermost substrate but to provide a relatively less expensive type of material for the inner substrate. This may provide the requisite strength and thickness requirements while also allowing a potentially greater amount of light to come into contact with the PV layers. Providing a lower transmissivity glass on the inner substrate on a side of the PV layers opposite the sun should not affect the performance of the overall module.

It will be appreciated by those skilled in the art that the use of glass substrates with two different compositions may result in the glass substrates having different heating coefficients. For example, the first glass substrate may have a relatively low iron percentage when compared to that of the second glass substrate. As the second glass substrate may have a higher iron count, it may heat up more rapidly than the first glass substrate (e.g., as a result of the iron absorbing more heat). Accordingly, the rate of thermal expansion for the first and second glass substrates may be different. It will be appreciated, however, that when the rate of thermal expansion for two laminated materials is different, the laminate may not hold, as the two materials expand and contract at different rates. Thus, identification of a correct heating profile for the laminate for the two materials may be desired. The CTE difference may be of interest, e.g., when infrared (IR) heating is used and/or IR exposure is encountered, given the different IR absorption rates implied by the different iron contents.

One way of approaching this problem is to adjust the amount of heat directed at either or both of the two materials. For example, under "normal" conditions, if the first glass substrate is heating slower than the second glass substrate, techniques may be used that either add heat to the first glass substrate or remove it from the second glass substrate (e.g., through a heat sink). Thus, the first (e.g., low iron) substrate may be preferentially heated in certain example embodiments so as to account for the difference in heating coefficient with respect to the second substrate. A heating profile of the assembly may be developed and optimized in certain example instances, e.g., so as to help ensure that the substrates are appropriately laminated to one another. An example heating profile may take into account the different glass compositions, etc. The compositions of the laminates also may be adjusted and/or particular laminates selected, e.g., to help account for such differences.

The laminating may involve heating the first and second substrates according to a heating profile that takes into account the different compositions of the first and second substrates. Similarly, the hot bending of the first and second substrates (e.g., together or separately) also may be done according to a heating profile that takes into account the different compositions of the first and second substrates.

In certain example embodiments, one or both of the substrates may be heat treated (e.g., heat strengthened or thermally tempered). The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an integrated PV module for a rooftop a vehicle, the method comprising:
    providing a first glass substrate having a first thickness;
    providing a second glass substrate substantially parallel to the first glass substrate having a second thickness, the second glass substrate having a higher iron content and lower visible transmission than the first glass substrate;
    inserting a solar cell array between the first and second glass substrates; and
    laminating together the first and second glass substrates with the solar cell array therebetween, wherein
    the total amount of iron present in the first glass substrate is in the range of 0.001 to 0.06% wt. %, and
    wherein the laminating involves adjusting the amount of heating regarding temperature of the first and second glass substrates to account for differences in rate of thermal expansion of the first and second glass substrates due to the different iron content of the first and second glass substrates, so that a heating profile is used to heat the first glass substrate differently during the laminating compared to how the second glass substrate is heated during the laminating.

2. The method of claim 1, wherein the laminating is accomplished using a first amount of polyvinyl butyral (PVB) or ethyl vinyl acetate (EVA) located between the first glass substrate and the solar cell array, and a second amount of PVB or EVA located between the solar cell array and the second glass substrate.

3. The method of claim 2, wherein the laminating material is PVB, and the first and second amounts at least initially have a thickness of between about 0.38 mm and 0.76 mm.

4. The method of claim 1, wherein the thin film solar cell array includes copper indium gallium selenide (CIGS) based solar cells disposed onto a thin foil substrate.

5. The method of claim 1, further comprising hot-bending the first and second glass substrates.

6. A method of making a vehicle, the method comprising:
providing an integrated PV module according to claim 1; and
building the integrated PV module into the vehicle.

7. The method of claim 6, wherein the vehicle is an automobile and the integrated PV module is a sunroof.

8. A method of making an integrated photovoltaic (PV) module to be placed in a sunroof of a vehicle, the method comprising:
providing a first glass substrate, the first glass substrate having a thickness of between about 1.5-3.5 mm;
providing a second glass substrate substantially parallel to the first glass substrate;
providing a PV array between a major surface of the first glass substrate and a major surface of the second glass substrate; and
laminating together the first and second glass substrates with the PV array therebetween,
wherein the PV module is for use in a sunroof of the vehicle, wherein
the total amount of iron present in the first glass substrate is in the range of 0.001 to 0.06 wt. %, wherein the second glass substrate contains more iron than does the first glass substrate, and
wherein the laminating involves adjusting the amount of heating regarding temperature of the first and second glass substrates to account for differences in rate of thermal expansion of the first and second glass substrates due to the different iron content of the first and second glass substrates, so that a heating profile is used to heat the first glass substrate differently during the laminating compared to how the second glass substrate is heated during the laminating.

9. A method of making an integrated photovoltaic (PV) module to be placed in a sunroof of a vehicle, the method comprising:
providing a first glass substrate, the first glass substrate having a thickness of between about 1.5-3.5 mm;
providing a second glass substrate substantially parallel to the first glass substrate, the second glass substrate having a thickness between about 1.5 and 3.5 mm;
providing a PV array between a major surface of the first glass substrate and a major surface of the second glass substrate; and
laminating together the first and second glass substrates with the PV array therebetween,
wherein the PV module is for use in a sunroof of the vehicle, wherein
the total amount of iron present in the first glass substrate is in the range of 0.01 to 0.02 wt. %, wherein the second glass substrate contains more iron than does the first glass substrate, and the first glass substrate contains at least about four times as much antimony oxide as total iron oxide, and
wherein the laminating involves adjusting the amount of heating regarding temperature of the first and second glass substrates to account for differences in rate of thermal expansion of the first and second glass substrates due to the different iron content of the first and second glass substrates, so that a heating profile is used to heat the first glass substrate differently during the laminating compared to how the second glass substrate is heated during the laminating.

10. The method of claim 9, wherein the laminating comprises is using polyvinyl butyral (PVB) to laminate the first and second glass substrates to each other.

11. The method of claim 10, wherein the PVB has a thickness between about 0.38 mm and 0.76 mm.

12. The method of claim 9, wherein the PV array includes copper indium gallium selenide (CIGS) based solar cells disposed onto a thin foil substrate.

13. The method of claim 9, further comprising hot-bending the first and second glass substrates.

14. The method of claim 13, wherein the first and second glass, substrates are bent together at substantially the same time.

15. The method of claim 9, further comprising disposing a ceramic frit on a major surface of the first glass substrate in a predetermined pattern.

16. The method of claim 9, wherein the laminating is accomplished using UV curable liquid urethanes.

* * * * *